United States Patent [19]

King

[11] Patent Number: 4,998,026
[45] Date of Patent: Mar. 5, 1991

[54] DRIVER CIRCUIT FOR IN-CIRCUIT OVERDRIVE/FUNCTIONAL TESTER

[75] Inventor: Philip N. King, Fort Collins, Colo.

[73] Assignee: Hewlett Packard Company, Palo Alto, Calif.

[21] Appl. No.: 340,346

[22] Filed: Apr. 19, 1989

[51] Int. Cl.⁵ .................. H03K 3/023; H03K 5/01
[52] U.S. Cl. .................. 307/270; 307/268; 307/473; 307/494; 324/523; 324/527; 324/537; 324/73.1
[58] Field of Search ............. 307/270, 473, 490, 493, 307/494, 268; 324/523, 527, 531, 537, 73 PC

[56] References Cited

U.S. PATENT DOCUMENTS

| | | |
|---|---|---|
| 3,781,689 | 12/1973 | Marshall et al. |
| 3,965,468 | 6/1976 | Bronson |
| 4,486,674 | 12/1984 | Neely ............. 307/473 |
| 4,588,945 | 5/1986 | Groves et al. |
| 4,612,466 | 9/1986 | Stewart ............. 307/473 |
| 4,800,294 | 1/1989 | Taylor ............. 307/473 |
| 4,814,638 | 3/1989 | Weick ............. 307/473 |

Primary Examiner—John Zazworsky

[57] ABSTRACT

A driver circuit for use in a circuit board tester which tester can perform both functional and in-circuit tests on a given device under test (DUT). The tester provides a test signal representative of a command for the driver circuit to provide logic high or logic low signals to a given device under test (DUT). The driver includes an output stage for providing desired logic high and logic low signals in response to the test signal; and switch circuitry, connected between the tester and the output stage, for preventing the test signal from reaching the output stage in response to a second control signal. The driver circuit is also shown to include an amplifier which, during operation of the driver circuit, receives feedback from the output stage. In addition, the driver circuit includes another output stage which provides a feedback signal when the driver circuit is in tri-state (deactivated). The driver circuit provides a low output impedance when logic high and logic low signals are being provided and a high output impedance when the driver circuit is in tri-state.

5 Claims, 2 Drawing Sheets

DRIVER CIRCUIT FOR IN-CIRCUIT OVERDRIVE/FUNCTIONAL TESTER

FIELD OF THE INVENTION

The present invention relates to the field of circuit testing and more particularly to the field of "in-circuit" testing of digital devices and functional testing of digital devices.

BACKGROUND OF THE INVENTION

As the use and complexity of digital circuits has increased in approximately the last decade, so also has the need to test such circuits increased in order to ensure proper operation. Basically, two types of digital circuit test techniques have been developed, namely functional test techniques and so-called in-circuit test techniques.

In functional test techniques a known digital pattern is applied to the circuit input and a comparison is made of the circuit output with an expected output. The differences between the actual and expected outputs provides an indication of circuit operation. Unfortunately, this technique is only useful when it is desirable to know the overall operation of a circuit, for example a circuit which has been assembled onto a printed circuit board. Very often it is desirable to test individual circuit elements or groups of elements which have been assembled onto a printed circuit board apart from the overall circuit operation.

In in-circuit testing techniques, testing is performed on a circuit element or elements isolated from the remainder of the circuit. In-circuit testing techniques generally involve the application of a preselected digital pattern to the input of an individual circuit element, a so-called device under test (DUT), and the comparison of the DUT response to an expected response. Since the circuit element or elements under test typically are connected to other circuit elements, it is required to overdrive any digital pattern or signal which is being applied by an "upstream" circuit element or logic device. Upstream logic devices are those devices whose outputs normally drive the inputs of the DUT. An overdrive signal is a signal which is superimposed at a selected location in a circuit.

In relation to such in-circuit testing several devices have been described. U.S. Pat. No. 3,781,689 discusses a pulse generator which provides three output states for use in an in-circuit probe, namely logic high, logic low and an "off" state, the so-called three-state or TRI-STATE.

In order to perform multiple simultaneous in-circuit tests on several individual circuit elements mounted on a single printed circuit board, test devices such as that disclosed in U.S. Pat. No. 4,588,945 were developed. In such devices a printed circuit board having circuit elements mounted thereon is in turn mounted or affixed to a so-called bed of nails. Each nail acts as an individual probe either providing a preselected signal to or receiving an output signal from a DUT. As described in that patent, a controller module applies multiple pregenerated signal patterns to multiple DUTs through a driver module. The DUT responses are received through a sensor module and compared to expected responses. As discussed in that patent, the driver module is made up of a multiplicity of identical driver circuits which generate the actual voltage signals provided to selected probes or nails in the test bed or bed of nails. These circuits each provide logic high, logic low and an "off" state, i.e. the so-called tri-state.

Two major problems, however, existed with such prior art driver circuit technology: problems involving (1) too high an output impedance during logic high and logic low states, resulting in poor voltage accuracy at high currents, and (2) limited speed. Regarding the first problem, as a load on the driver circuit becomes greater (higher output current) a high output impedance will force the error component present in the output voltage to be greater than it would be with a lower output impedance. Thus, prior art drivers, for both in-circuit and functional testing, exhibited both high output impedance and low voltage accuracy at the DUT. In addition, prior art drivers for in-circuit testing are relatively slow, lacking the speed required for functional testing.

SUMMARY OF THE INVENTION

The present invention provides a solution to the above-mentioned problems with a three-stateable closed-loop feedback driver which is capable of driving arbitrary current loads in both in-circuit and functional testing. In particular, the feedback feature of the present invention serves to improve voltage accuracy, that is, reduce errors in the signal which is applied to the DUT. Prior art drivers did not employ closed-loop circuit topologies because of the difficulties in keeping a feedback driver stable since it tends to oscillate with arbitrary loads. It is also difficult to build a tri-stateable feedback circuit.

The invention is achieved in a driver circuit for use in a circuit board tester which can perform both functional and in-circuit tests. The driver circuit comprises three stages, with the output of the first stage producing the input to both the second and third stages. There are also alternate feedback paths between the (1) output of the second stage and the input of the first stage or (2) the output of the third stage and the input of the first stage. A switch intervenes in the second feedback path. A resistor intervenes in the first feedback path.

The first stage comprises a high gain amplifier stage. The second stage comprises a current buffer which serves as a high-output-impedance driver. The third stage comprises a another current buffer, used as a high current driver.

The circuit board tester provides a test signal and a control signal to the driver circuit. The test signal will be either logic-high or logic-low. The test signal is one input to the first stage, the gain stage. A second input to the gain stage is a feedback path which feeds back the output of either the second or the third stage of the driver circuit. The control signal controls the third stage. The third stage is a three-stateable device. The circuit board tester control signal controls which state the third stage will obtain. The output of the third stage is connected to a given DUT. The driver circuit is designed so that if the third stage is in three-state (off), then the second feedback path is open. Otherwise, the third stage will mimic the state of the test signal (logic-high or logic-low) and the first feedback path is preempted by the second feedback path.

DETAILED DESCRIPTION

Figure 1:
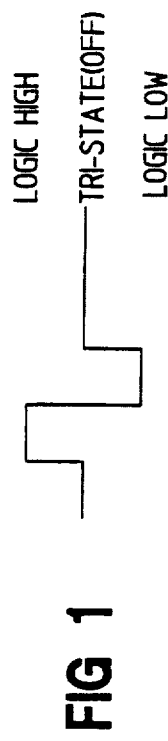
FIG. 1 is a diagrammatic representation of the three states of a three-state signal: logic high, logic low and three-state ("off")

FIG. 1 is a diagrammatic representation of the three states of a three-state signal: logic high, logic low and three-state ("off"). FIG. 1 shows the three states of a signal which can be applied to a DUT by a three-stateable driver.

Figure 2:
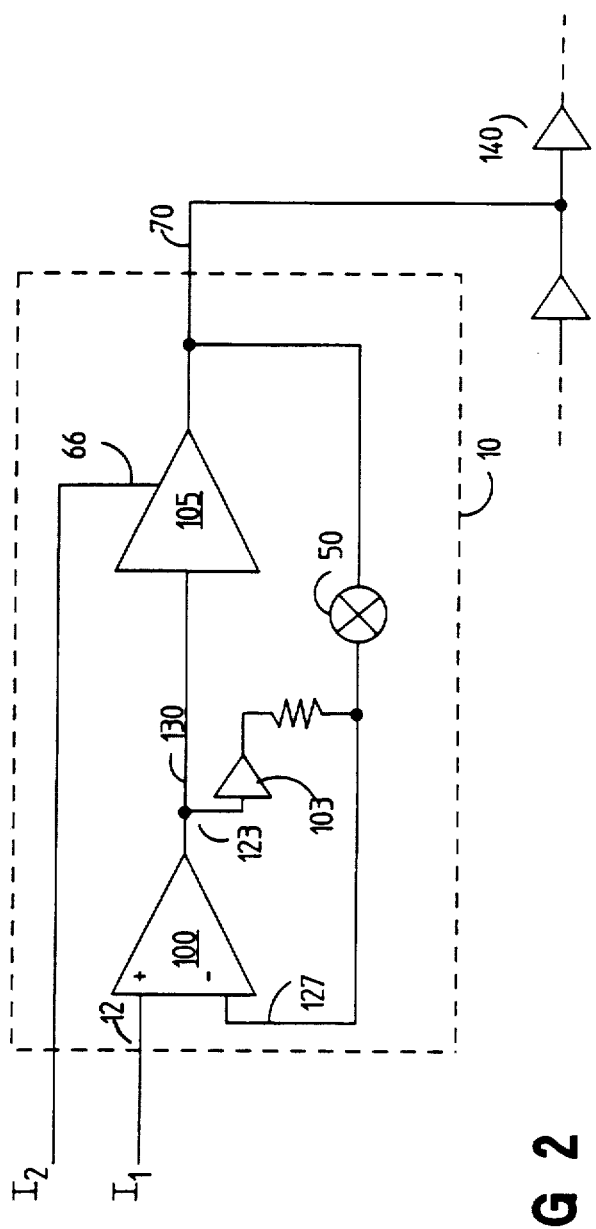
FIG. 2 is a schematic block diagram of the present invention.

FIG. 2 shows a novel driver circuit 10 which would be incorporated within a circuit board tester (not shown). The circuit board tester would be used to provide various signals, such as test signal $I_1$ control signal $I_2$. Signal $I_1$ is a predetermined test signal which would be applied, via driver circuit 10 and output path 70, to a predetermined device under test (DUT), such as DUT 140. Control signal $I_2$ is a predetermined control signal which the circuit board tester (not shown) would produce to control driver circuit 10. Also not shown is the various prior art circuit board tester apparatus which would be used to detect and process the response of DUT 140 to the application of test signal $I_1$ via driver 10 and path 70.

Driver circuit 10 comprises gain stage amplifier 100 having inputs 12 and 127, output paths 123 and 130, high-output impedance buffer 103, three-stateable buffer 105, feedback path 125, switch 50, and resistor 110. As noted, $I_1$ is a predetermined test signal (which will be either logic-high or logic-low) which is to be applied to DUT 140. $I_2$ is a predetermined control signal which causes three-stateable buffer 105 to either mimic $I_1$ or to obtain a high-impedance three-state (off). The state of buffer 105 will be transmitted as a signal over line 70 to DUT 140. When buffer 105 is in three-state, switch 50 is open so that there is no feedback between the output of buffer 105 and gain stage amplifier 100. Instead, the three-state feedback path to the input of amplifier 100 is through buffer 103 and resistor 110; this three-state feedback path 110 keeps amplifier 100 from saturating when buffer 105 is in three-state and switch 50 is open. When buffer 105 is not in tri-state, then switch 50 is closed and the operative feedback path will be along path 125 through switch 50, keeping amplifier 100 from saturating. The result is a three-stateable feedback driver circuit capable of driving arbitrary loads for both in-circuit and functional testing.

Figure 3:
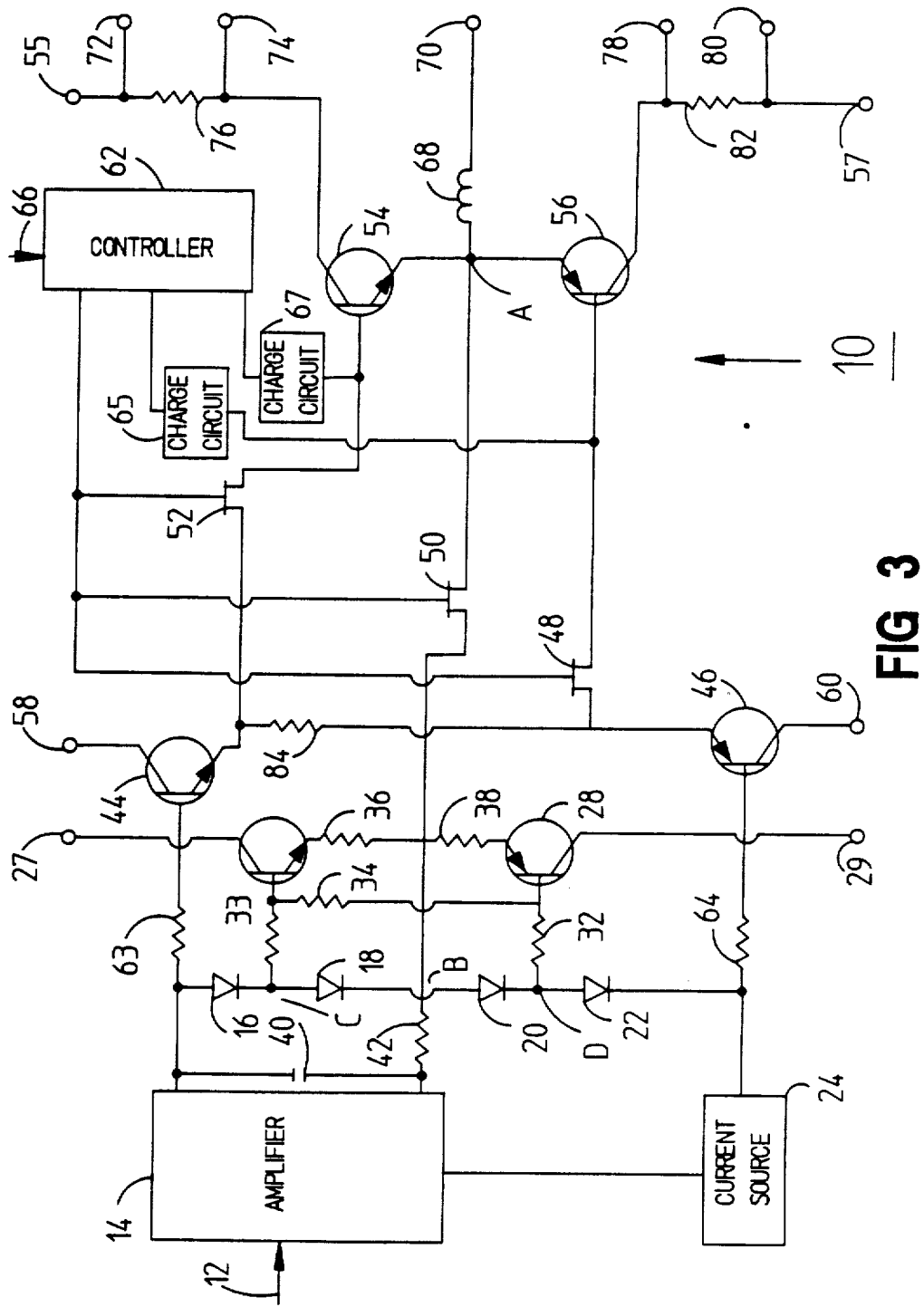
FIG. 3 is a detailed blow-up drawing of FIG. 2.

FIG. 3 is a detailed blow-up drawing of FIG. 2. The three stages and two feedback paths of FIG. 2 can be identified in FIG. 3. Gain stage amplifier 100 of FIG. 2 comprises element 14, 40, 42, 16, 18, 20, 22 and 24 in FIG. 3. Buffer 103 of FIG. 2 comprises elements 32, 33, 34, 26, 28, 27 and 29 in FIG. 3. Resistor 110 of FIG. 2 comprises elements 36 and 38 in FIG. 3. Switch 50 of FIG. 2 is shown in FIG. 3. Input lines 12 and 66 of FIG. 2 are shown in FIG. 3. Output line 70 FIG. 2 is shown in FIG. 3. The feedback path from the output of buffer 105, along path 125, through switch 50 and along path 127 in FIG. 2, runs from node A through switch 50 to node B in FIG. 3. The three-state feedback path along path 123, through buffer 103, resistor 110 and path 127 in FIG. 2, can take one of two forms in FIG. 3: (1) beginning at node C, through elements 33, 26, and 36 to node B; or (2) beginning at node D through elements 32, 28 and 38 to node B. The remainder of FIG. 3 comprises buffer 105.

A pregenerated pattern or control signal is provided to input 12 from any suitable circuit board tester controller module (not shown). The pattern at 12 is provided to amplifier 14 which in conjunction with voltage level setting diodes 16, 18, 20, and 22 serves to provide the gain and level shift stages of the driver circuit. A fixed current source 24 is provided as the current source for amplifier 14 and the level shifting networks. Since any one of several known amplifier and current source combinations will be sufficient for the purposes of the invention, the details of these devices are not shown. However, it should be noted that in the preferred embodiment, amplifier 14 is a so-called single ended output differential amplifier with a cascade gain stage and source 24 serves to provide current source biasing to such amplifier.

Transistor 26 is an npn type transistor having its collector connected to a supply voltage, which in the preferred embodiment is a positive 12 V. Transistor 28 is a pnp type transistor having its collector connected to a supply voltage, preferably a negative 10 V. A resistor array, composed of resistors 32-38 serves to maintain the bias levels, i.e., the voltage levels, of transistors 26 and 28 at relatively low levels.

Capacitor 40 serves to establish the so-called dominant pole of driver circuit 10 at the front end, thereby reducing the tendency of driver circuit 10 to oscillate. Capacitor 40 is configured as a modified Miller capacitor to control the bandwidth of amplifier 14. It should be noted that because feedback is provided to amplifier 14 from both the high impedance output stage (buffer 103 and resistor 110) and from the high current output stage (buffer 105), greater voltage accuracy at high current levels is achieved during the high current state and it is also possible to keep amplifier 14 linear during the so-called three-state.

Buffer 105 of FIG. 2. includes transistors 44, 46, 54 and 56 of FIG. 3. Transistors 54 and 56 are arranged in an emitter follower configuration and serve to provide the high output currents required for overdriving in in-circuit testing. In the preferred embodiment transistor 54 is a 2N4401 and transistor 56 is a 2N4403. While other transistors may exist which can be substitutes for transistors 54 and 56, such substitutes should exhibit the following properties: high current capability at low Vce, sufficiently high bandwidth to provide fast output swings, sufficiently high bandwidth to not become the dominant pole of circuit 10, high enough gain to reach high output currents without the need for excessive base current, and high breakdown voltage for protection from abuse. It should also be noted that the selection of preferred transistors 54 and 56 also provides sufficient speed for functional testing. The collector of transistor 54 is connected through a current sensing resistor to a positive supply voltage at 55 which in the preferred embodiment is nominal 12 V. Similarly, the collector of transistor 56 is connected through a current sensing resistor to a negative supply voltage at 57 which in the preferred embodiment is a nominal negative 10 V.

Transistors 44 and 46 are also arranged as emitter followers and serve to provide a buffer between amplifier 14 and transistors 54 and 56, respectively. The collector of transistor 44 is connected to a supply voltage at 58, which in the preferred embodiment is 12 V. The collector of transistor 46 is connected to a supply voltage at 60, which is a preferred negative 10 V. Resistors 63 and 64 serve to add to the stability of the emitter follower arrangements.

Transistors 48, 50 and 52 are field effect transistors (FET) and, as will be explained, serve to create the tri-state condition. As is known, FET devices operate such that when the gate to source voltage is approximately zero, current can flow in either direction between drain and source, i.e. the FET is on. When the gate to source voltage is large (negative for n-channel devices), however, current does not flow between drain and source. With FETs 48, 50 and 52 in the "on" state, base drive current is supplied to transistors 54 and 56 and the high current output feedback path is connected resulting in a low impedance feedback driver amplifier. With FETs 48, 50 and 52 in the "off" state, no base drive current will be provided to transistors 54 and 56, and the feedback path from the high current output is disconnected. Therefore, with the FETs in the "off" state, the output of driver 10 will be in the high impedance three-state condition. In the preferred embodiment, transistors 48, 50 and 52 are n-channel JFETs having the designation 2N4393.

Transistors 48–52 are controlled by an appropriate voltage signal supplied by three-state controller 62. Basically, in the circuit shown in FIG. 3, the three-state is achieved when the FETs are off, the logic high and logic low states are achieved when the FETs are conducting current between drain and source. Consequently, any of a number of circuit arrangements will be acceptable for controller 62, so long as it is capable of quickly generating appropriate voltages at the gates of the FETs in response to a control signal at 66. Such control signal would be provided or controlled by the test controller which also provides input to amplifier 14 at input 12. It will be noted that transistors 54 and 56 are also connected to three-state controller 62. It has been found that the speed by which transistors 54 and 56 turn on and turn off could be improved if series RC charge injection circuits 65 and 67 are added to the base of each transistor. Such circuits serve to transfer charge in or out of the base region as appropriate to aid in switching.

A ferrite bead 68 is provided in output 70 of circuit 10 to prevent oscillation. Such a ferrite bead has the characteristics of low resistance at low frequency and at higher frequency an increased resistance. Such resistance helps keep the output stable when a capacitive load is applied.

Test points 72 and 74, provided on either side of resistor 76 serve to allow sensing of the current flowing to transistor 54. Similarly, test points 78 and 80, provided on either side of resistor 82, allow sensing of the current flowing from transistor 56. Such sensing can be useful for driver protection circuitry (not shown).

Resistor 84 is provided between the emitters of transistors 44 and 46. This arrangement provides a current path during the high impedance off state which allows transistors 44 and 46 to remain on. Resistor 84 also serves to moderate the signal applied to the base of transistors 54 and 56.

Consider now the circuit of FIG. 3 during operation. Assume that it is desired to overdrive with a positive pulse the DUT. Initially circuit 10 is in the three-state, a high impedance "off" state. In this state a negative voltage is being applied to the gates of FETs 48, 50 and 52 resulting in no current flowing between source and drain. Transistors 54 and 56 ar therefore turned off and are not supplying any voltage to output 70. With transistors 54, 56 and 50 off, output 70 obtains a state of high output impedance, that is, a high output impedance is present at output 70. Also during this state resistor 84 is conducting current between transistors 44 and 46, keeping them turned on. Additionally, buffer 103, i.e., transistors 26 and 28, is providing feedback, keeping amplifier 14 from saturating.

When it is desired to provide a logic high output at 70, the in-circuit test controller (not shown) provides signals to inputs 12 and 66. The signal provided at input 66 is representative of a command for controller 62 to provide an almost zero gate-to-source voltage to FETs 48, 50 and 52 which will make those devices conductive between drain and source. The command or signal provided to amplifier 14 is appropriately amplified and when provided to the base of transistor 44 results in current flow from supply voltage point 58 through transistor 44 and FET 52, since transistor 52 is now conductive. The current now applied to the base of transistor 54 results in current flowing from supply voltage point 55 to output 70. In other words a logic high edge is provided at 70. The feedback provided to amplifier 14 from output 70 through the path including now conductive (low impedance) FET 50 and resistor 42 serves to provide output accuracy and a low output impedance.

While the invention has been described and illustrated with reference to specific embodiments, those skilled in the art will recognize that modification and variations may be made without departing from the principles of the invention as described herein above and set forth in the following claims.

What is claimed is:

1. A driver circuit for providing a test signal to a device under test, wherein said test signal is responsive to a combination of a predetermined logic signal and a control signal from a circuit board tester, said driver circuit comprising:
   a gain amplifier, having first and second input ports and at least one output port, for receiving said predetermined logic signal from said tester at said first input port and providing an output signal at said output port responsive to said predetermined logic signal and for receiving a feedback signal at said second input port;
   a first buffer, connected to receive said output signal, for generating a first feedback signal, said first buffer having a high output impedance;
   a second buffer, connected to receive said output signal and said control signal, for buffering said output signal and for providing said test signal, responsive to said output signal, to said device under test; and
   feedback means for providing a feedback signal to said second input port wherein said feedback signal comprises said first feedback signal when said test signal is representative of three-state and wherein said feedback signal comprises said test signal at all other times.

2. The driver circuit of claim 1, wherein said feedback means comprises switch means for providing said test signal to said second input port when said driver circuit is not in said three-state.

3. The driver circuit of claim 2, wherein said switch means provides a low output impedance when said driver circuit is not in said tri-state and wherein said switch means provides a high output impedance when said driver circuit is in said three-state.

4. The driver circuit of claim 3, wherein said switch means comprises a field effect transistor.

5. The driver circuit of claim 1, wherein said first feedback signal prevents said gain amplifier from saturating when said driver circuit is in said three-state.

* * * * *